(12) United States Patent
Hashimoto

(10) Patent No.: US 8,351,619 B2
(45) Date of Patent: Jan. 8, 2013

(54) AUDITORY SENSE CORRECTION DEVICE

(75) Inventor: Takeshi Hashimoto, Tokyo (JP)

(73) Assignee: Clarion Co., Ltd., Tokyo (JP)

( * ) Notice: Subject to any disclaimer, the term of this patent is extended or adjusted under 35 U.S.C. 154(b) by 309 days.

(21) Appl. No.: 12/680,744

(22) PCT Filed: Oct. 22, 2008

(86) PCT No.: PCT/JP2008/069088
§ 371 (c)(1),
(2), (4) Date: Mar. 30, 2010

(87) PCT Pub. No.: WO2009/057488
PCT Pub. Date: May 7, 2009

(65) Prior Publication Data
US 2010/0208917 A1  Aug. 19, 2010

(30) Foreign Application Priority Data

Oct. 30, 2007  (JP) .................................. 2007-281158

(51) Int. Cl.
*H03G 9/00* (2006.01)
(52) U.S. Cl. ...................................................... 381/102
(58) Field of Classification Search .................. 381/98, 381/101–103, 320
See application file for complete search history.

(56) References Cited

U.S. PATENT DOCUMENTS

| 5,745,586 | A * | 4/1998 | Tagami et al. ................ 381/103 |
| 6,965,676 | B1 | 11/2005 | Allred |
| 7,058,188 | B1 * | 6/2006 | Allred ............................ 381/107 |
| 2004/0213420 | A1 | 10/2004 | Gundry et al. |
| 2007/0133821 | A1 * | 6/2007 | Yamaguchi ..................... 381/96 |
| 2007/0133831 | A1 * | 6/2007 | Kim et al. ....................... 381/313 |
| 2007/0291959 | A1 | 12/2007 | Seefeldt |
| 2009/0080675 | A1 * | 3/2009 | Smirnov et al. ................. 381/98 |

FOREIGN PATENT DOCUMENTS

| EP | 0740410 | 10/1996 |
| JP | 63-5607 | 1/1988 |
| JP | 6-177688 | 6/1994 |
| JP | 7-122953 | 5/1995 |

(Continued)

OTHER PUBLICATIONS

Supplementary European Search Report for corresponding EP Application No. 08844489, Apr. 11, 2011.

(Continued)

*Primary Examiner* — Ping Lee
(74) *Attorney, Agent, or Firm* — Ditthavong Mori & Steiner, P.C.

(57) ABSTRACT

There is provided an auditory sense correction device capable of adding favorable loudness characteristics to an output sound without depending on sound source characteristics of an audio signal even when a high-frequency band or a low-frequency band of the audio signal has already been subjected to loudness correction. The auditory sense correction device 1 includes: a loudness processing section 2 which applies loudness processing to audio signals on a frequency band basis, a gain calculation section 4 which calculates a level difference between a signal level of each frequency band and signal level of original frequency band; and gain setting section 5 which applies a correction gain of each frequency band to the audio signal of each frequency band that has been subjected to loudness processing.

12 Claims, 14 Drawing Sheets

FOREIGN PATENT DOCUMENTS

| | | |
|---|---|---|
| JP | 2000-197182 | 7/2000 |
| JP | 2001-24459 | 1/2001 |
| JP | 2002-84154 | 3/2002 |
| JP | 2006-20231 | 1/2006 |
| JP | 2006-333396 | 12/2010 |
| WO | WO 2004/098053 | 11/2004 |
| WO | WO 2006/047600 | 5/2006 |

OTHER PUBLICATIONS

Chinese Office Action for corresponding CN Application No. 200880114197.4, Aug. 23, 2012.

\* cited by examiner

TABLE 1: ATTACK/RELEASE SETTING

| ATTACK/RELEASE FILTER | ATTACK TIME | RELEASE TIME |
|---|---|---|
| LOW-FREQUENCY ATTACK/RELEASE FILTER SECTION A | 10 msec | 2 sec |
| HIGH-FREQUENCY ATTACK/RELEASE FILTER SECTION A | 10 msec | 0.5 sec |
| LOW-FREQUENCY ATTACK/RELEASE FILTER SECTION B | 1 sec | 1 sec |
| HIGH-FREQUENCY ATTACK/RELEASE FILTER SECTION B | 1 sec | 1 sec |

FIG. 7

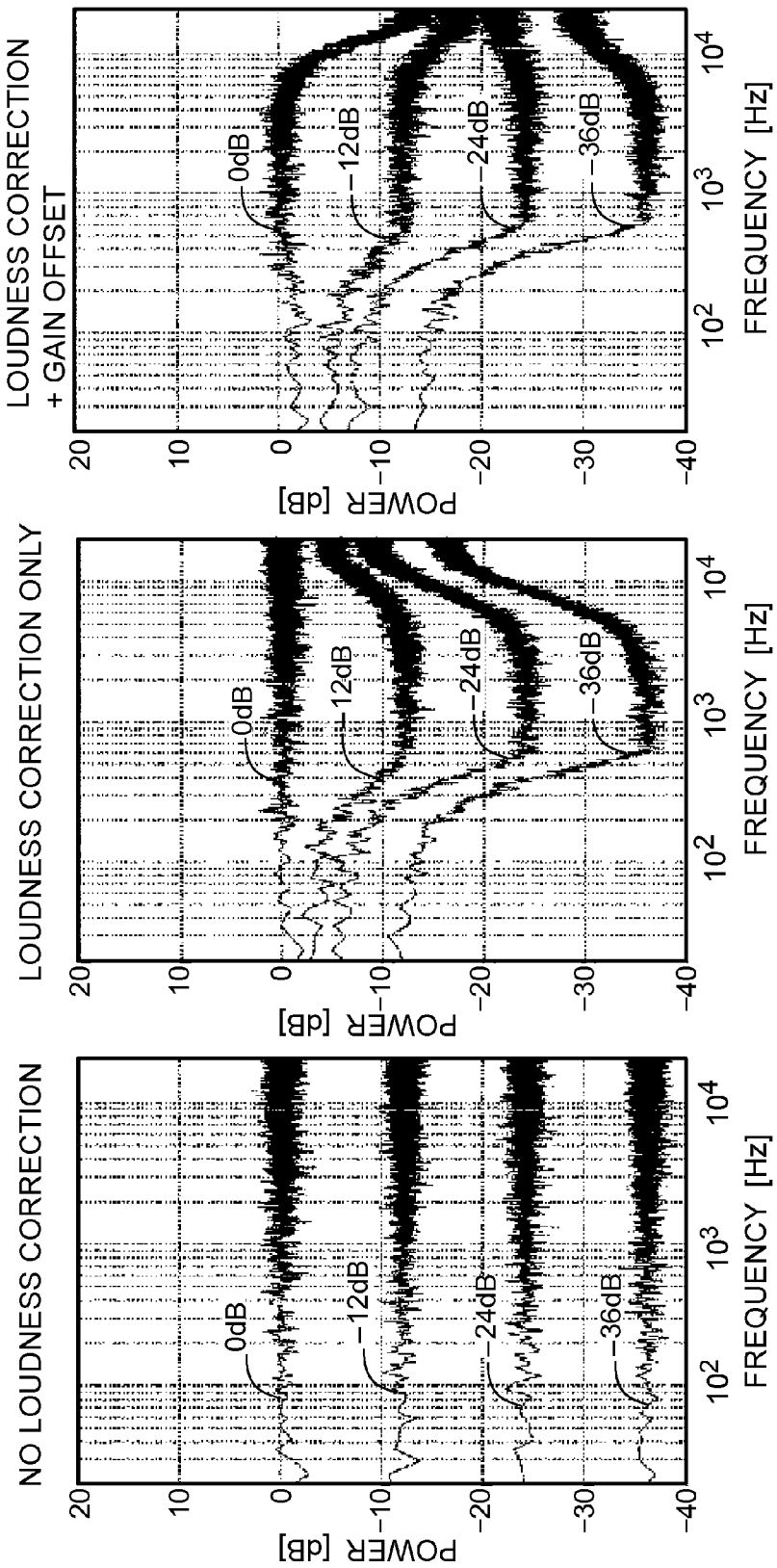

ness characteristics to an output sound without depending on sound source characteristics of an audio signal even when the high-frequency band or low-frequency band of the audio signal has already been subjected to loudness correction.

Means for Solving the Problems

AUDITORY SENSE CORRECTION DEVICE

TECHNICAL FIELD

The present invention relates to an auditory sense correction device and, more particularly, to an auditory sense correction device that divides an audio signal into audio signals of different frequency bands, applies filtering to the audio signals, and combines the resultant audio signals to thereby add loudness characteristics to the combined audio signal.

BACKGROUND ART

An audio reproduction apparatus typically has a volume controller for controlling the volume of sound output from a speaker. A user operates the volume controller to suitably control the volume of sound output from a speaker, etc.

However, a general volume controller can only achieve a certain volume control range (e.g., from about +6 dB to 12 dB), and simply operating the volume controller cannot meet demand of achieving a wider volume control range or audio quality having sufficient loudness.

In order to meet such demand, a loudness control device (auditory sense correction device) that corrects auditory sense with respect to the volume of an output sound has been proposed (refer to, e.g., Patent Document 1). The loudness control device divides an audio signal into audio signals of different frequency bands: low-frequency band, medium-frequency band, and high-frequency band and combines the audio signals of the respective frequency bands while changing the gains of low frequency, medium frequency, and high frequency in conjunction with the operation amount of a volume controller so as to output the combined audio signal from a speaker, etc., thereby achieving auditory sense correction.

Patent Document 1: JP-A-2000-197182 (pages 4 and 5, FIG. 1)

DISCLOSURE OF THE INVENTION

Problems to be Solved by the Invention

The abovementioned loudness control device applies gain change (gain correction) to the audio signals of different frequency bands obtained by frequency band division and then combines the resultant audio signals to thereby achieve the loudness correction (auditory sense correction). However, audio sources constituting an audio signal include various categories such as classic, pop, and rock. Further, among each of the categories, there are many audio sources in which the output level of the low-frequency or high-frequency band has previously been enhanced. Therefore, when the loudness correction as described above is applied to the audio signal composed of the audio sources in which the output level has previously been enhanced for each frequency band, the output level of the low-frequency or high-frequency band may further be enhanced undesirably although the output level thereof has already been enhanced. The audio signal in which the output level of the high-frequency or low-frequency band has been extremely enhanced may produce sound that is hard to hear in terms of auditory sense due to enhanced output level of the high-frequency or low-frequency band or causes distorted sound to be output from a speaker to significantly deteriorate the audio quality.

The present invention has been made in view of the above problem, and an object thereof is to provide an auditory sense correction device capable of adding favorable loudness characteristics to an output sound without depending on sound source characteristics of an audio signal even when the high-frequency band or low-frequency band of the audio signal has already been subjected to loudness correction.

Means for Solving the Problems

To solve the above problem, according to the present invention, there is provided an auditory sense correction device including: a loudness processing section that divides an audio signal into audio signals of different frequency bands and applies loudness processing on a frequency band basis; a level difference calculation section that calculates, for each frequency band, a difference between the signal level of the audio signal of each frequency band that has been subjected to the loudness processing by the loudness processing section and signal level of an audio signal of the original frequency band that has been subjected to the loudness processing as a differential signal; a gain offset section that applies, for each frequency band, offset processing to the gain of the audio signal of the original frequency band that has been subjected to the loudness processing based on the differential signal calculated for each frequency band by the level difference calculation section; and a gain setting section that multiplies the audio signal of each frequency band that has been subjected to the loudness processing by the correction gain of each frequency band that has been subjected to the offset processing by the gain offset section and adds the audio signal of each frequency band that has been subjected to the multiplication processing and audio signal of the original frequency band that has been subjected to the loudness processing.

According to the auditory sense correction device of the present invention, the correction gain of each frequency band that to be subjected to offset processing based on the differential signal of each frequency band is multiplied with the audio signal of each frequency band that has been subjected to the loudness processing and then added to the audio signal of the original frequency band. Thus, the gain value for correction processing to be applied to the audio signal that has been subjected to the loudness processing can be calculated for each frequency band in accordance with a differential signal of each frequency band indicating the level difference. Therefore, by applying the calculated gain values for correction processing to the audio signals of respective frequency bands that have been subjected to the loudness processing, it is possible to add suitable loudness effect for each frequency band, thereby making the sound quality of the audio signal finally output better.

The auditory sense correction device may include: a first response speed control section that performs response speed control for the audio signal of the original frequency band that has been subjected to the loudness processing by the loudness processing section to make a change in the signal level of the audio signal gradual; and a gain correction section that applies gain correction to the audio signal whose signal level has been changed by the first response speed control section in accordance with the frequency band to be subjected to the offset processing by the gain offset section, in which the gain offset section performs the offset processing for the signal that has been subjected to the gain correction by the gain correction section.

By performing gain correction for each frequency band after the first response speed control section makes a change in the signal level of the audio signal gradual of the original frequency band that has been subjected to the loudness processing, it is possible to previously obtain the audio signal suitably applied to the subsequent offset processing performed by the gain offset section. This makes the offset processing performed by the gain offset section more effective.

The auditory sense correction device may include: a second response speed control section that performs response speed control for the differential signal calculated for each frequency band by the level difference calculation section to average the differential signal for each frequency band; and an offset calculation section that calculates, for each frequency band, the gain offset amount used in the offset processing performed by the gain offset section based on the differential signal averaged for each frequency band by the second response speed control section, in which the gain offset section performs the offset processing by using the gain offset amount calculated for each frequency band by the offset calculation section.

By performing the response speed control for the differential signal calculated for each frequency band by the level difference calculation section, it is possible to average the difference signal for each frequency band. Thus, it is possible to easily and effectively calculate, for each frequency band, the gain offset amount for use in the subsequent offset processing.

Advantages of the Invention

According to the auditory sense correction device of the present invention, the correction gain of each frequency band to be subjected to offset processing based on the differential signal of each frequency band is applied to the audio signal of each frequency band that has been subjected to the loudness processing. Thus, it is possible to perform adequate gain correction in accordance with the level of the audio signal of each frequency band that has been subjected to the loudness processing, allowing application of suitable loudness correction to the audio signal without depending on the high-frequency or low-frequency acoustic characteristics of the audio signal. This prevents distorted sound from being output from a speaker, which allows a user to listen to music with high sound quality.

BRIEF DESCRIPTION OF THE DRAWINGS

FIG. 7 is a table showing attack time and release time set for each of a low-frequency attack/release filter section A, a low-frequency attack/release filter section B, a high-frequency attack/release filter section A, and a high-frequency attack/release filter section B.

FIGS. 13(a) to 13(c) show frequency characteristic changes of white noises in the case where input signal levels are set to 0 dB, −12 dB, −24 dB and −36 dB, respectively, wherein FIG. 13(a) shows the frequency characteristic changes of white noises in the case where any correction has not been applied, FIG. 13(b) shows the frequency characteristic changes of white noises in the case where only the loudness correction is applied, and FIG. 13(c) shows the frequency characteristic changes of white noises in the case where both the loudness correction and gain offset processing are applied.

FIGS. 14(a) to 14(c) show frequency characteristic changes of pink noises in the case where input signal levels are set to 0 dB, −12 dB, −24 dB and −36 dB, respectively, wherein FIG. 14(a) shows the frequency characteristic changes of pink noises in the case where any correction has not been applied, FIG. 14(b) shows the frequency characteristic changes of pink noises in the case where only the loudness correction is applied, and FIG. 14(c) shows the frequency characteristic changes of pink noises in the case where both the loudness correction and gain offset processing are applied.

Figure 1:
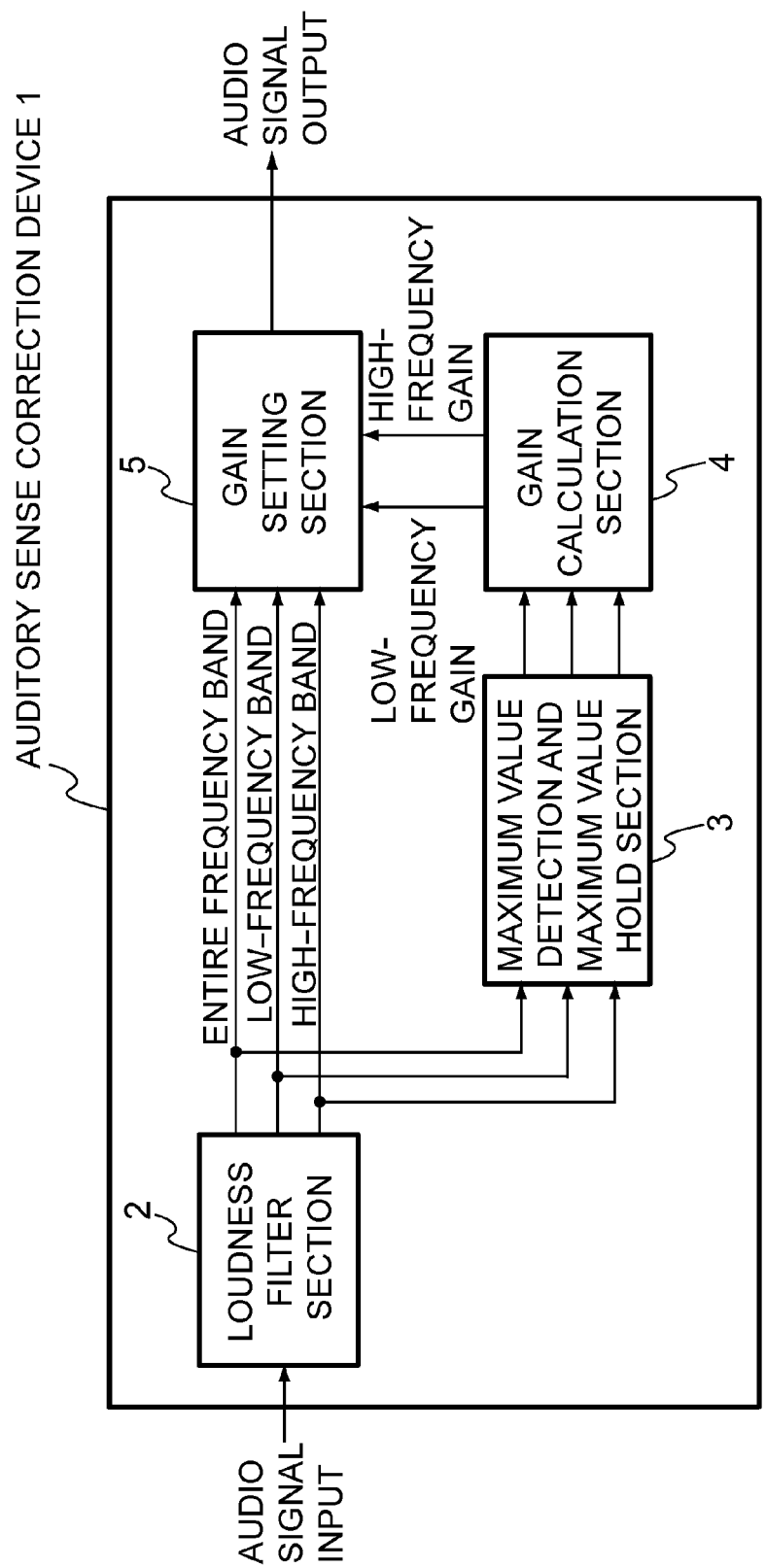
FIG. 1 is a block diagram showing a schematic configuration of an auditory sense correction device according to an embodiment of the present invention.

DESCRIPTION OF REFERENCE NUMERALS 1 auditory sense correction device
2 loudness filter section (frequency band divider)
3 maximum value detection and maximum value hold section
4 gain calculation section 5 gain setting section (gain setter)
7 LPF section (of loudness filter section)
8 HPF section (of loudness filter section)
9, 10, 11 delay section
12, 13, 14 maximum value detection section (of maximum value detection and maximum value hold section)
16, 17, 18 maximum value hold section (of maximum value detection and maximum value hold section)
20, 21, 22 limiter section (of maximum value detection and maximum value hold section)
25 low-frequency level calculation section (of gain calculation section) (level difference calculator)
26 high-frequency level calculation section (of gain calculation section) (level difference calculator)
28 low-frequency attack/release filter section A (of gain calculation section) (first response speed controller)
29 low-frequency attack/release filter section B (of gain calculation section) (second response speed controller)
30 high-frequency attack/release filter section A (of gain calculation section) (first response speed controller)
31 high-frequency attack/release filter section B (of gain calculation section) (second response speed controller)
33 low-frequency lookup table section (of gain calculation section) (gain corrector)
34 high-frequency lookup table section (of gain calculation section) (gain corrector)
36 low-frequency offset calculation section (of gain calculation section) (offset calculator)
37 high-frequency offset calculation section (of gain calculation section) (offset calculator)
39 low-frequency gain offset section (of gain calculation section) (gain offset calculator)
40 high-frequency gain offset section (of gain calculation section) (gain offset calculator)
41 low-frequency gain conversion section (of gain calculation section)
42 high-frequency gain conversion section (of gain calculation section)
43, 44 LPF section (of gain calculation section)
46, 47 multiplication section (of gain setting section)
48 addition section (of gain setting section)

BEST MODE FOR CARRYING OUT THE INVENTION

Now, an auditory sense correction device according to the present invention will be described. The auditory sense correction device of the present invention applies loudness processing to audio signals of different frequency bands (low-frequency band and high-frequency band, in the present embodiment) obtained by frequency band division with sound source characteristics of an audio signal taken into consideration to thereby add favorable sound effect irrespective of the sound source characteristics of the original audio signal.

FIG. 1 is a block diagram showing a schematic configuration of the auditory sense correction device. An auditory sense correction device 1 includes a loudness filter section (frequency band divider) 2, a maximum value detection and maximum value hold section 3, a gain calculation section 4, and a gain setting section (gain setter) 5.

[Loudness Filter Section]

Figure 2:
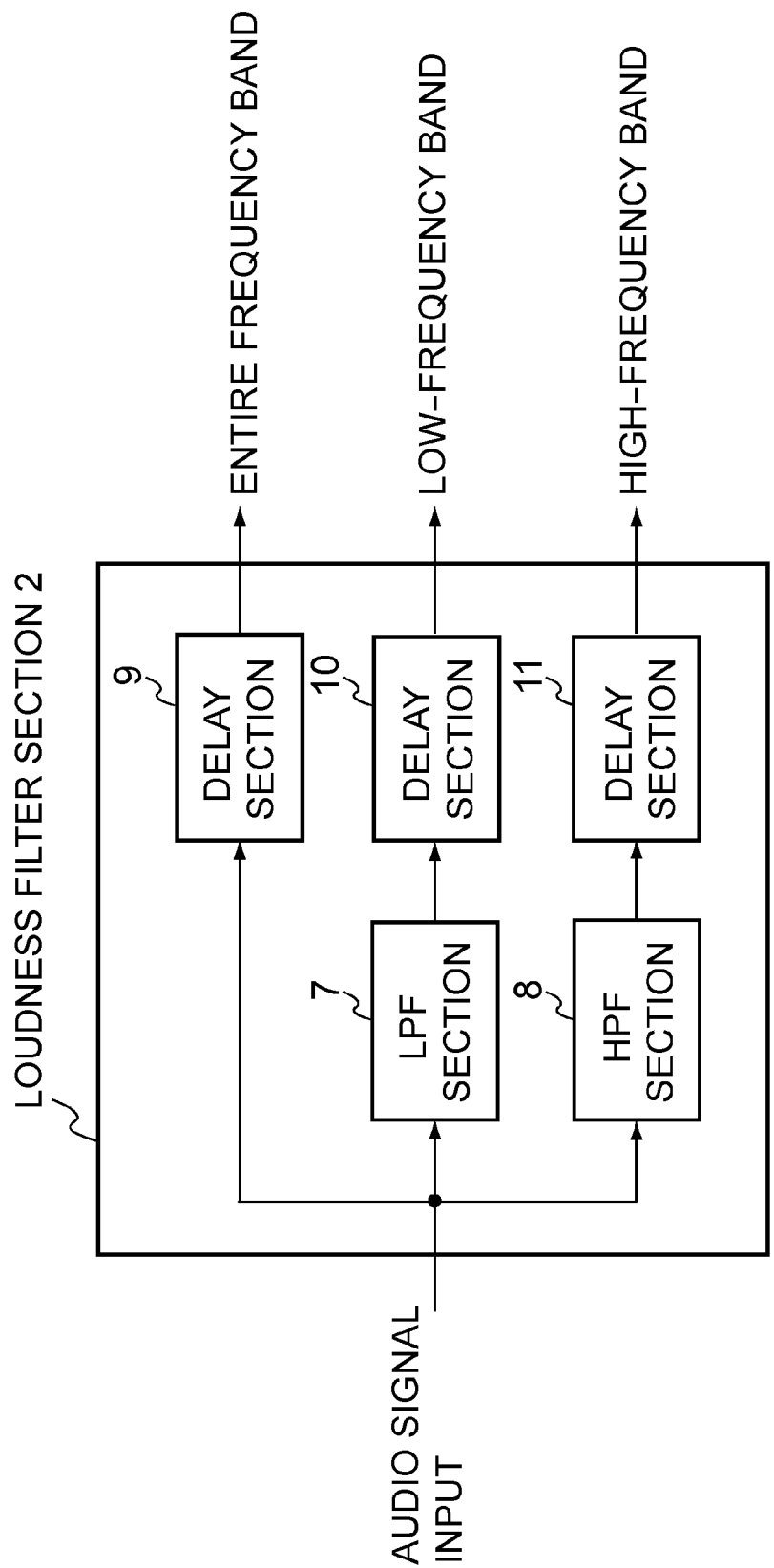
FIG. 2 is a block diagram showing a schematic configuration of a loudness filter section according to the present embodiment.

The loudness filter section 2 divides an input audio signal into audio signals of three frequency bands: original, low, and high-frequency bands and applies loudness processing for respective frequency bands. As shown in FIG. 2, the loudness filter section 2 includes an LPF section 7 constituted by a low-pass filter, an HPF section 8 constituted by a high-pass filter, and three delay sections 9, 10, and 11.

Figure 3:
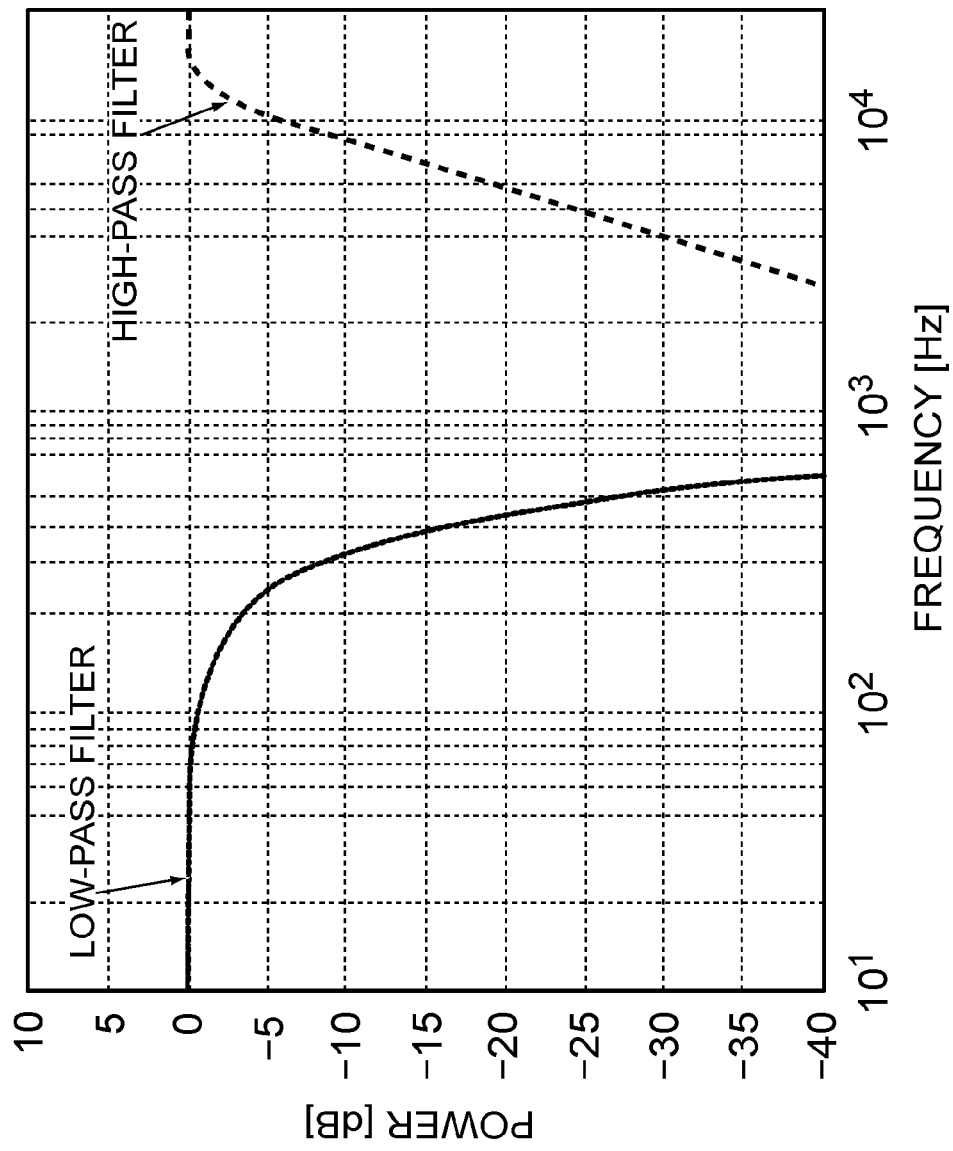
FIG. 3 is a graph showing filter characteristics of high-pass and low-pass filters used in a loudness filter section of the present embodiment.

As the low-pass filter and high-pass filter, a linear-phase FIR (Finite Impulse Response) filter, a first-order IIR (Infinite Impulse Response) filter with a phase shift of up to ±90 degrees, or the like is used. FIG. 3 is a graph showing filter characteristics in the case where the FIR filter is used as the low-pass filter and high-pass filter. In FIG. 3, the tap number and cut-off frequency of the low-pass filter are set to 192 and 100 Hz, respectively, and those of the high-pass filter are set to 16 and 10 kHz, respectively.

When the high-pass filter and low-pass filter shown in FIG. 3 are used at the same time as the HPF section 8 and the LPF section 7, respectively, a delay difference is given among the audio signal of the original frequency band, audio signal that has been subjected to filtering in the low-frequency band, and audio signal that has been subjected to filtering in the high-frequency band.

In order to cope with the above problem, the delay sections 9 to 11 are used to set a delay corresponding to 96 taps (192/2) in the original frequency band, set a delay corresponding to 88 taps ((192/2)−(16/2)) in the HPF section 8 in which the filtering is applied by the high-pass filter, and set a delay corresponding to 0 tap in the LPF section 7 in which the filtering is applied by the low-pass filter. This allows the adjustment of the audio signals of three frequency bands: original, low, and high-frequency bands output from the loudness filter section 2 to have the same phase.

Further, as described later, the gain setting section 5 performs correction processing using a low-frequency gain and a high-frequency gain. However, due to processing of the maximum value detection and maximum value hold section 3 and processing of the gain calculation section 4, there is a possibility that a delay difference may occur between timings of the low-frequency gain correction and high-frequency gain correction to be applied to the audio signals that have been subjected to the filtering in the loudness filter section 2. Delay processing for eliminating this delay difference is also executed in the above delay sections 9 to 11.

[Maximum Value Detection and Maximum Value Hold Section 3]

Figure 4:
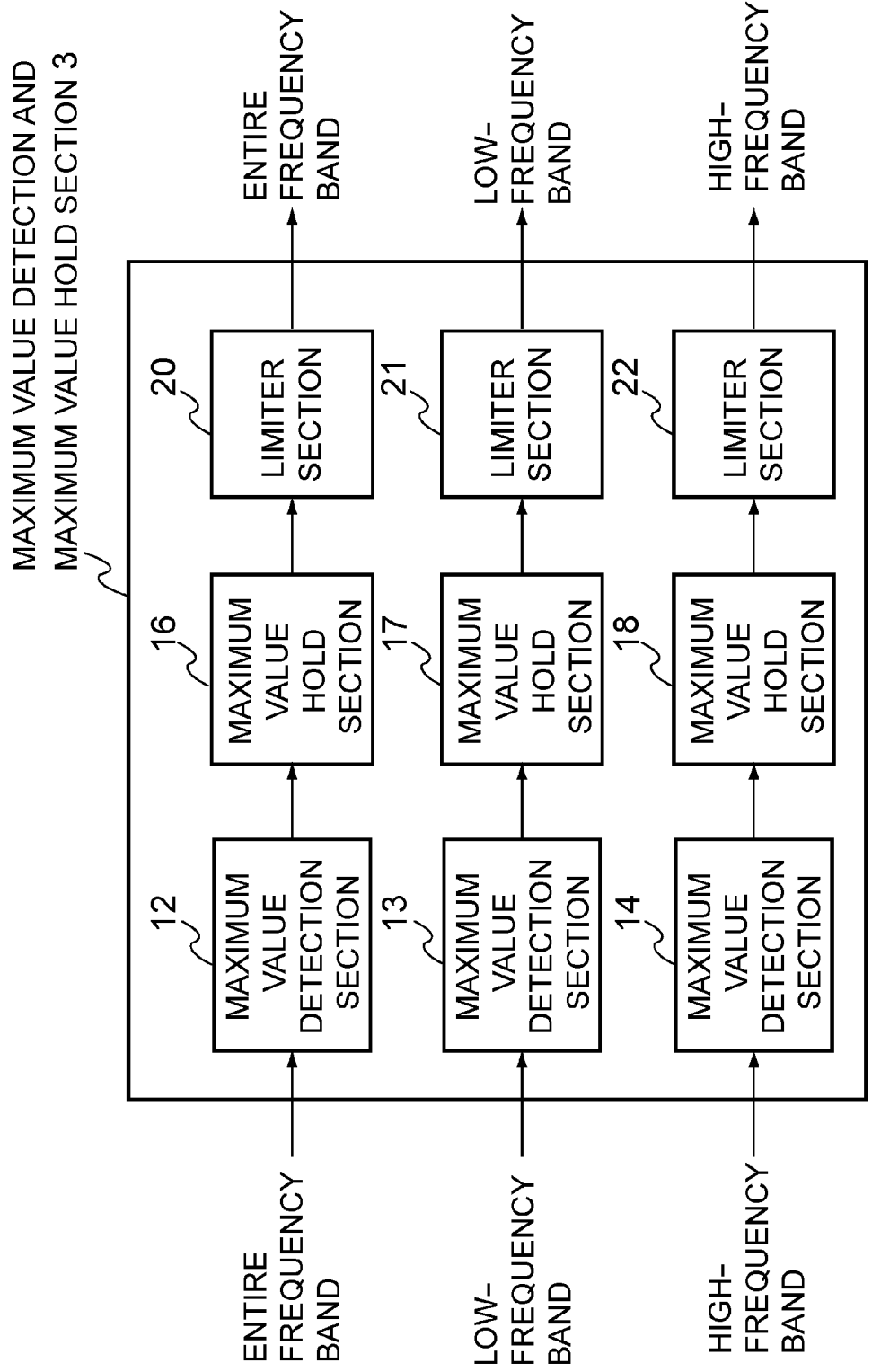
FIG. 4 is a block diagram showing a schematic configuration of a maximum value detection and maximum value hold section according to the present embodiment.

The maximum value detection and maximum value hold section 3 calculates the absolute values of output signals based on the audio signals of the original, low, and high-frequency bands obtained by the frequency division performed in the loudness filter section 2 and limits the upper and lower limits of the absolute value calculated for each audio signal. As shown in FIG. 4, the maximum value detection and maximum value hold section 3 includes maximum value detection sections 12, 13, and 14, maximum value hold sections 16, 17, and 18, and limiter sections 20, 21, and 22, the maximum value detection sections, maximum value hold sections, and limiter sections being provided for respective audio signals of the original, low, and high-frequency bands.

The maximum value detection sections 12, 13, and 14 calculate the absolute values of the audio signals for respective frequency bands and detect the maximum values of the absolute values within a predetermined range. FIG. 5(a) shows an example of a maximum value detection state in the audio signal of the original frequency band, FIG. 5(b) shows an example of a maximum value detection state in the audio signal of the low-frequency band, and FIG. 5(c) shows an example of a maximum value detection state of the audio signal in the high-frequency band. In the examples of FIGS. 5(a) to 5(c), the audio signals are pink noise, and the sampling frequency and maximum value detection time interval are set to 48 kHz and 2 msec, respectively.

Figure 5:
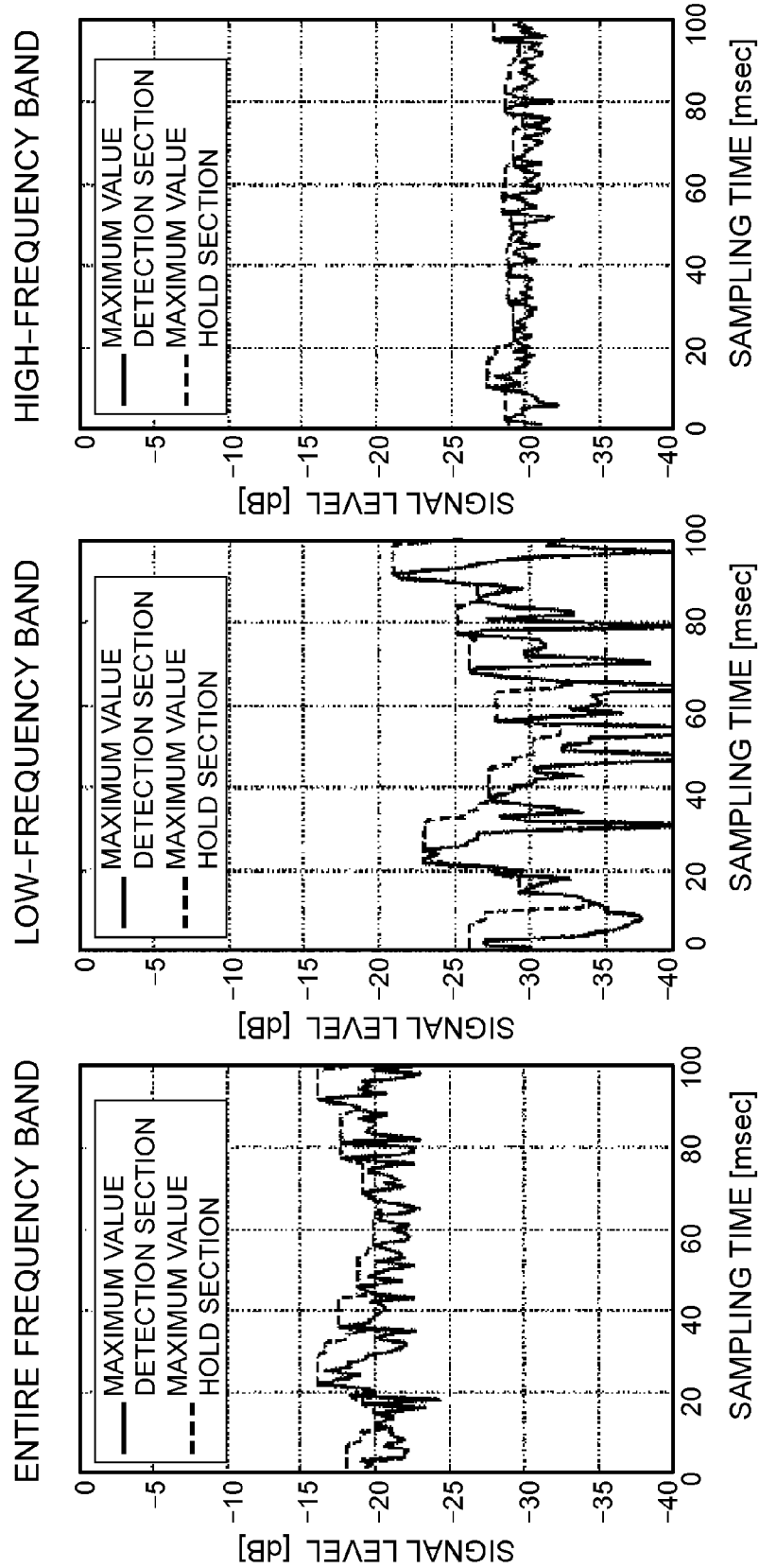
FIG. 5(a) is a graph showing temporal changes of the maximum value detected in an audio signal of the original frequency band and its held value.
FIG. 5(b) is a graph showing temporal changes of the maximum value detected in an audio signal of the low-frequency band and its held value.
FIG. 5(c) is a graph showing temporal changes of the maximum value detected in an audio signal of the high-frequency band and its held value.

The maximum value hold sections 16, 17, and 18 hold the maximum values which are detected for respective frequency bands by the maximum value detection sections 12, 13, and 14 for a predetermined time period. FIG. 5(*a*) shows an example in which the maximum value in the audio signal of the original frequency band which is detected by the maximum value detection section 12 is held for a predetermined time period by the maximum value hold section 16. FIG. 5(*b*) shows an example in which the maximum value in the audio signal of the low-frequency band which is detected by the maximum value detection section 13 is held for a predetermined time period by the maximum value hold section 17. FIG. 5(*c*) shows an example in which the maximum value in the audio signal of the high-frequency band which is detected by the maximum value detection section 14 is held for a predetermined time period by the maximum value hold section 18. In the examples of FIGS. 5(*a*) to 5(*c*), the maximum value hold time is set to 16 msec.

The limiter sections 20, 21, and 22 set the upper and lower limits of the maximum values held by the maximum value hold sections 16, 17, and 18. In the examples of FIGS. 5(*a*) to 5(*c*), the upper and lower limits of the audio signals whose maximum values are held are set to 0 dB and −60 dB, respectively, and 2 msec is set as one sampling period plotted on the horizontal axis.

[Gain Calculation Section 4]

The gain calculation section 4 calculates a high-frequency gain and a low-frequency gain for applying gain correction to the high and low-frequency portions of the audio signal that have been subjected to the loudness processing by the loudness filter section 2.

Figure 6:
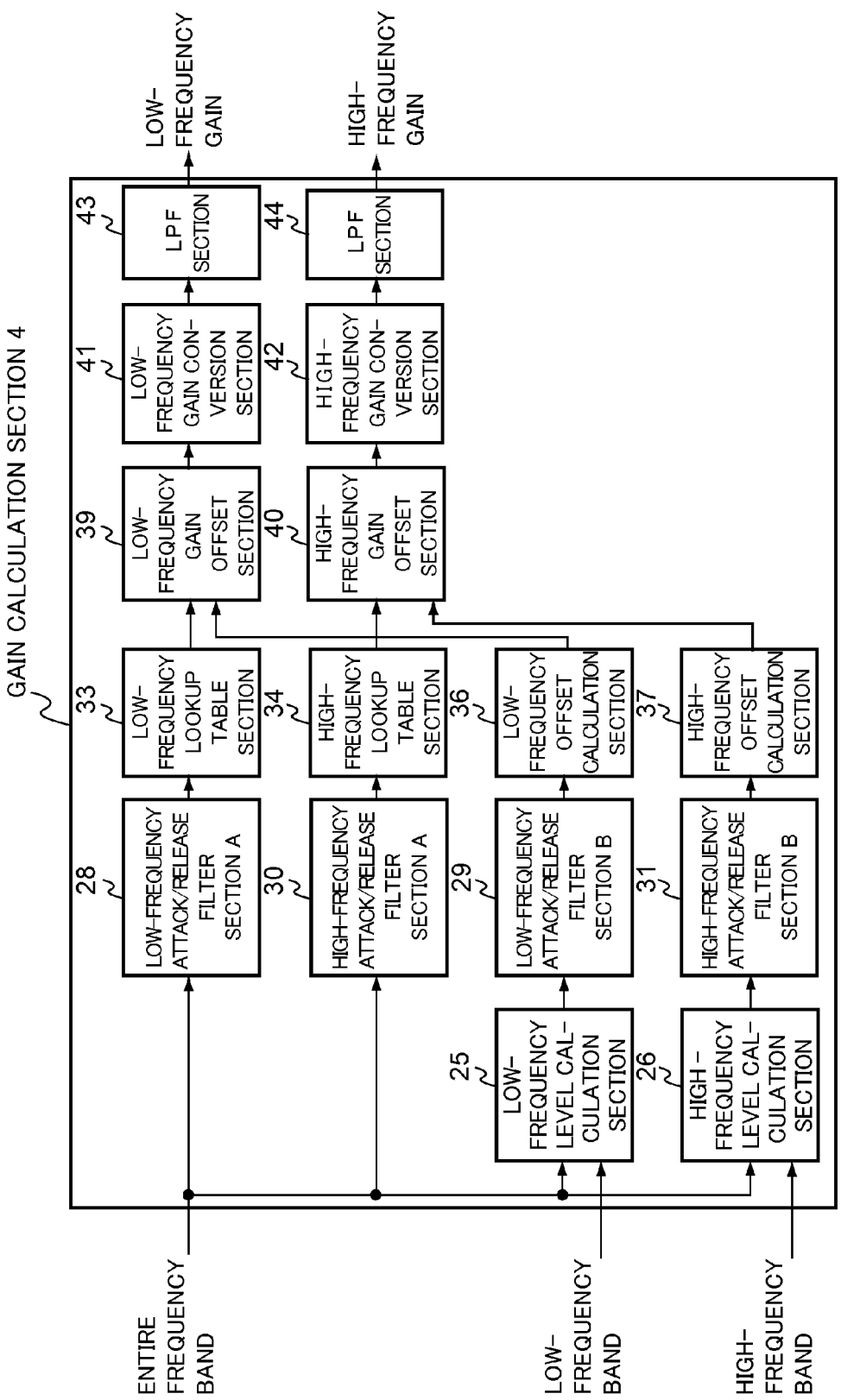
FIG. 6 is a block diagram showing a schematic configuration of a gain calculation section according to the present embodiment.

As shown in FIG. 6, the gain calculation section 4 includes a low-frequency level calculation section (level difference calculator) 25, a high-frequency level calculation section (level difference calculator) 26, a low-frequency attack/release filter section A (first response speed controller) 28, a low-frequency attack/release filter section B (second response speed controller) 29, a high-frequency attack/release filter section A (first response speed controller) 30, a high-frequency attack/release filter section B (second response speed controller) 31, a low-frequency lookup table section (gain corrector) 33, a high-frequency lookup table section (gain corrector) 34, a low-frequency offset calculation section (offset calculator) 36, a high-frequency offset calculation section (offset calculator) 37, a low-frequency gain offset section (gain offset calculator) 39, a high-frequency gain offset section (gain offset calculator) 40, a low-frequency gain conversion section 41, a high-frequency gain conversion section 42, and LPF sections 43 and 44.

The low-frequency level calculation section 25 compares the level of a maximum value hold signal (audio signal) of the original frequency band and level of a maximum value hold signal (audio signal) of the low-frequency band which are input from the maximum value detection and maximum value hold section 3. Then, the low-frequency level calculation section 25 outputs the detected level difference to the low-frequency attack/release filter section B 29 as a differential signal.

On the other hand, the high-frequency level calculation section 26 compares the level of a maximum value hold signal (audio signal) of the original frequency band and level of a maximum value hold signal (audio signal) of the high-frequency band which are input from the maximum value detection and maximum value hold section 3. Then, the high-frequency level calculation section 26 outputs the compared level difference to the high-frequency attack/release filter section B 31 as a differential signal.

The low-frequency attack/release filter section A 28, low-frequency attack/release filter section B 29, high-frequency attack/release filter section A 30, and high-frequency attack/release filter section B 31 each apply a filter in which a predetermined attack time and a predetermined release time have been set to an input audio signal so as to control the response speed.

The attack time indicating how fast the filter responds to a volume change, and release time indicating how slowly the changed volume is set back to the original state.

In the low-frequency attack/release filter section A 28, low-frequency attack/release filter section B 29, high-frequency attack/release filter section A 30, and high-frequency attack/release filter section B 31 of the present embodiment, the attack time and release time are set as shown in Table 1 of FIG. 7. The attack and release times set in Table 1 are merely examples and are not limited to these values.

Figure 8:
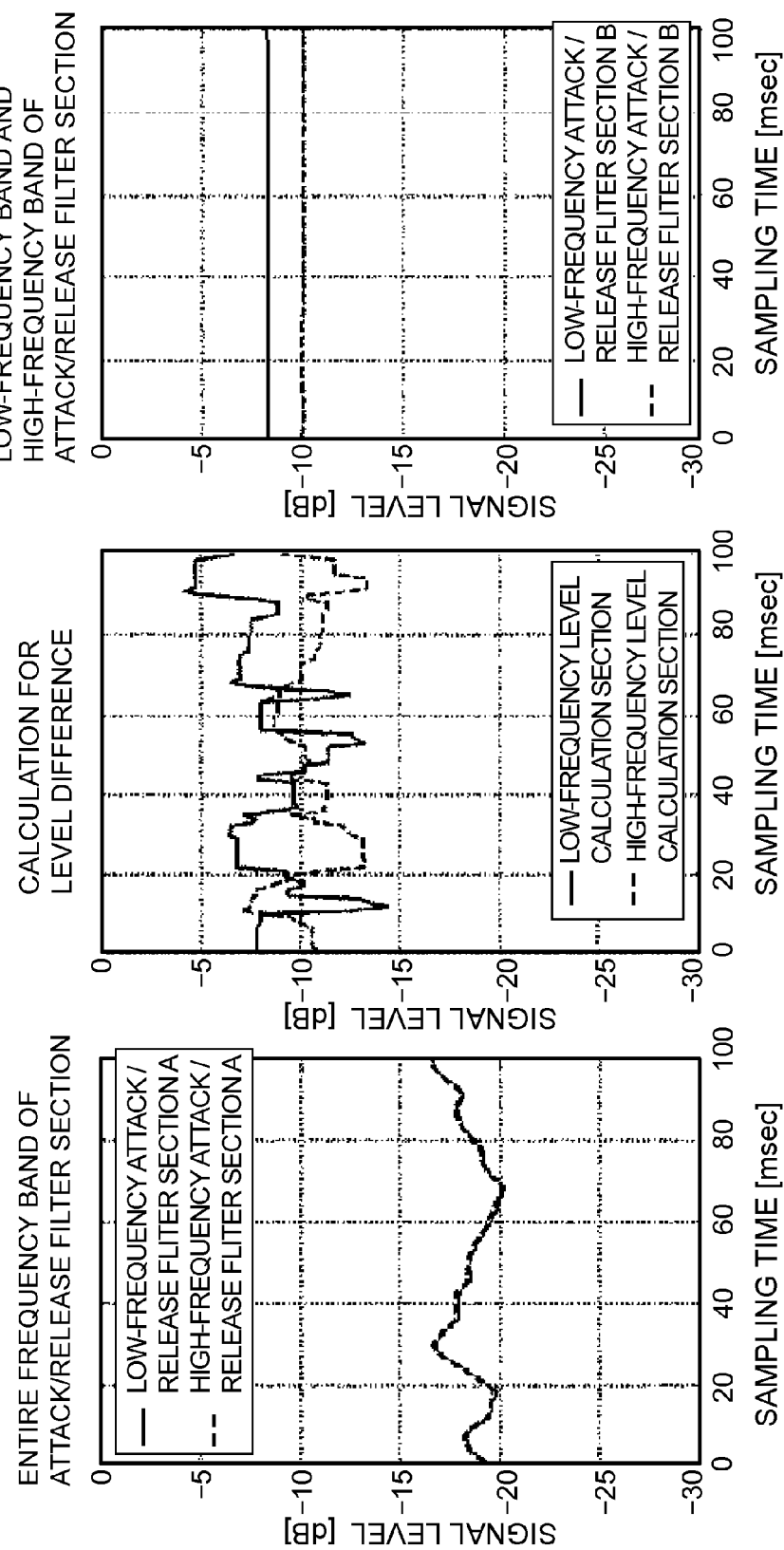
FIG. 8(a) is a graph showing level changes of audio signals obtained through filtering that the low-frequency attack/release filter section A and high-frequency attack/release filter section A apply to audio signals of the original frequency band.
FIG. 8(b) is a graph showing differential signals before application of the filtering performed by the low-frequency attack/release filter section B and high-frequency attack/release filter section B.
FIG. 8(c) is a graph showing differential signals after application of the filtering performed by the low-frequency attack/release filter section B and high-frequency attack/release filter section B.

FIG. 8(*a*) is a graph showing level changes of the audio signals obtained through the filtering that the low-frequency attack/release filter section A 28 and high-frequency attack/release filter section A 30 in each of which the attack time and release time shown in Table 1 have been set apply to the audio signals of the original frequency band input from the maximum value detection and maximum value hold section 3.

In the audio signals shown in FIG. 8(*a*), application of the filtering performed by the low-frequency attack/release filter section A 28 and high-frequency attack/release filter section A 30 makes a change in the signal level more gradual than in the maximum value hold signal of the original frequency band shown in FIG. 5(*a*). Note that the attack times and release times in the low-frequency attack/release filter section A 28 and high-frequency attack/release filter section A 30 are set to comparatively close values as shown in Table 1. Accordingly, two signals shown in FIG. 8(*a*) have substantially equal characteristics.

FIG. 8(*b*) shows differential signals before application of the filtering performed by the low-frequency attack/release filter section B 29 and high-frequency attack/release filter section B 31. FIG. 8(*b*) shows a differential signal representing the level difference output from the low-frequency level calculation section 25 and a differential signal representing the level difference output from the high-frequency level calculation section 26.

FIG. 8(*c*) shows differential signals after application of the filtering performed by the low-frequency attack/release filter section B 29 and high-frequency attack/release filter section B 31. By setting the filters as shown in Table 1 of FIG. 7 to make the attack time comparatively long as well as to make the rising response speed slow, it is possible to obtain averaged high and low-frequency differential signals as shown in FIG. 8(*c*).

The low-frequency lookup table section 33 and high-frequency lookup table section 34 convert the levels of signals input from the low-frequency attack/release filter section A 28 and high-frequency attack/release filter section A 30. In the present embodiment, an output signal corresponding to the input signal is previously calculated and stored in the table for the level conversion.

Figure 9:
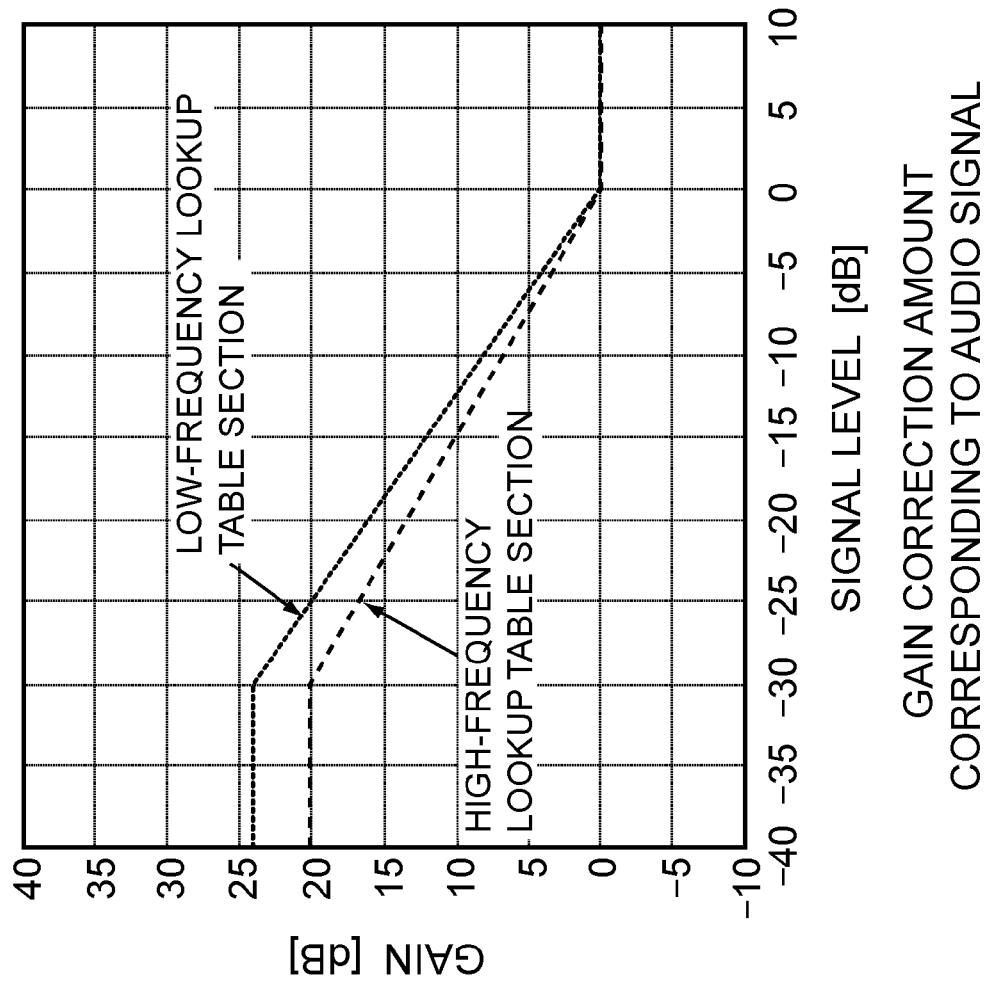
FIG. 9 is a graph showing correction amounts of filter gains applied in a low-frequency lookup table section and a high-frequency lookup table section according to the present embodiment.

FIG. 9 shows correction amounts of filter gains applied in the low-frequency lookup table section 33 and high-frequency lookup table section 34. As shown in FIG. 9, when the signal level is 0 dB, the filter gain amounts of the low-frequency lookup table section 33 and high-frequency lookup table section 34 are both 0 dB. When the signal level is −30 dB, the gain amount of the low-frequency lookup table section 33 is corrected to 24 dB, and gain amount of the high-frequency lookup table section 34 is corrected to 20 dB.

The graph of FIG. 9 showing the gain correction amount is merely an example of information for determining the gain correction amount. Therefore, the gain correction amount need not be set according to the graph of FIG. 9 and may appropriately be changed in accordance with the characteristics of the audio signal.

The low-frequency offset calculation section 36 and high-frequency offset calculation section 37 set offset amounts of the low-frequency gain and high-frequency gain based on the differential signals that have been subjected to the filtering by the low-frequency attack/release filter section B 29 and high-frequency attack/release filter section B 31.

Figure 10:
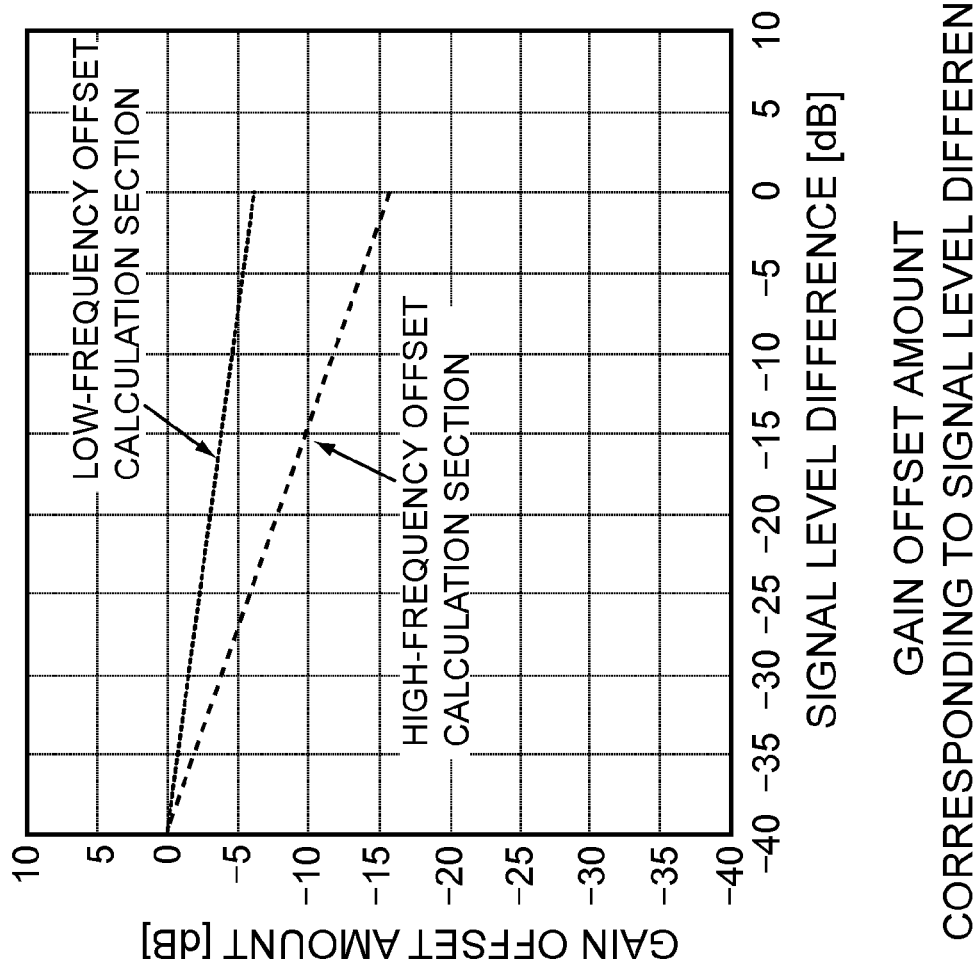
FIG. 10 is a graph showing gain offset amounts set in a low-frequency offset calculation section and a high-frequency offset calculation section according to the present invention.

FIG. 10 is a graph showing the gain offset amounts set in the low-frequency offset calculation section 36 and high-frequency offset calculation section 37. When the signal level difference in the differential signal is 0 dB, the gain offset amount of the low-frequency gain set in the low-frequency offset calculation section 36 is −6 dB, and gain offset amount of the high-frequency gain set in the high-frequency offset calculation section 37 is −16 dB. When the signal level difference in the differential signal is −40 dB, the gain offset amounts of the low-frequency gain set in the low-frequency offset calculation section 36 and high-frequency gain set in the high-frequency offset calculation section 37 are both 0 dB.

The graph of FIG. 10 showing the gain offset amount is merely an example of information for determining the gain offset amount. Therefore, the gain offset amount need not be set according to the graph of FIG. 10 and may appropriately be changed in accordance with the characteristics of the audio signal.

The low-frequency gain offset section 39 and high-frequency gain offset section 40 set the offset amounts for the gain amounts of the input signals that have been subjected to the level correction in the low-frequency lookup table section 33 and high-frequency lookup table section 34.

Figures 11A, 11B, 11C:
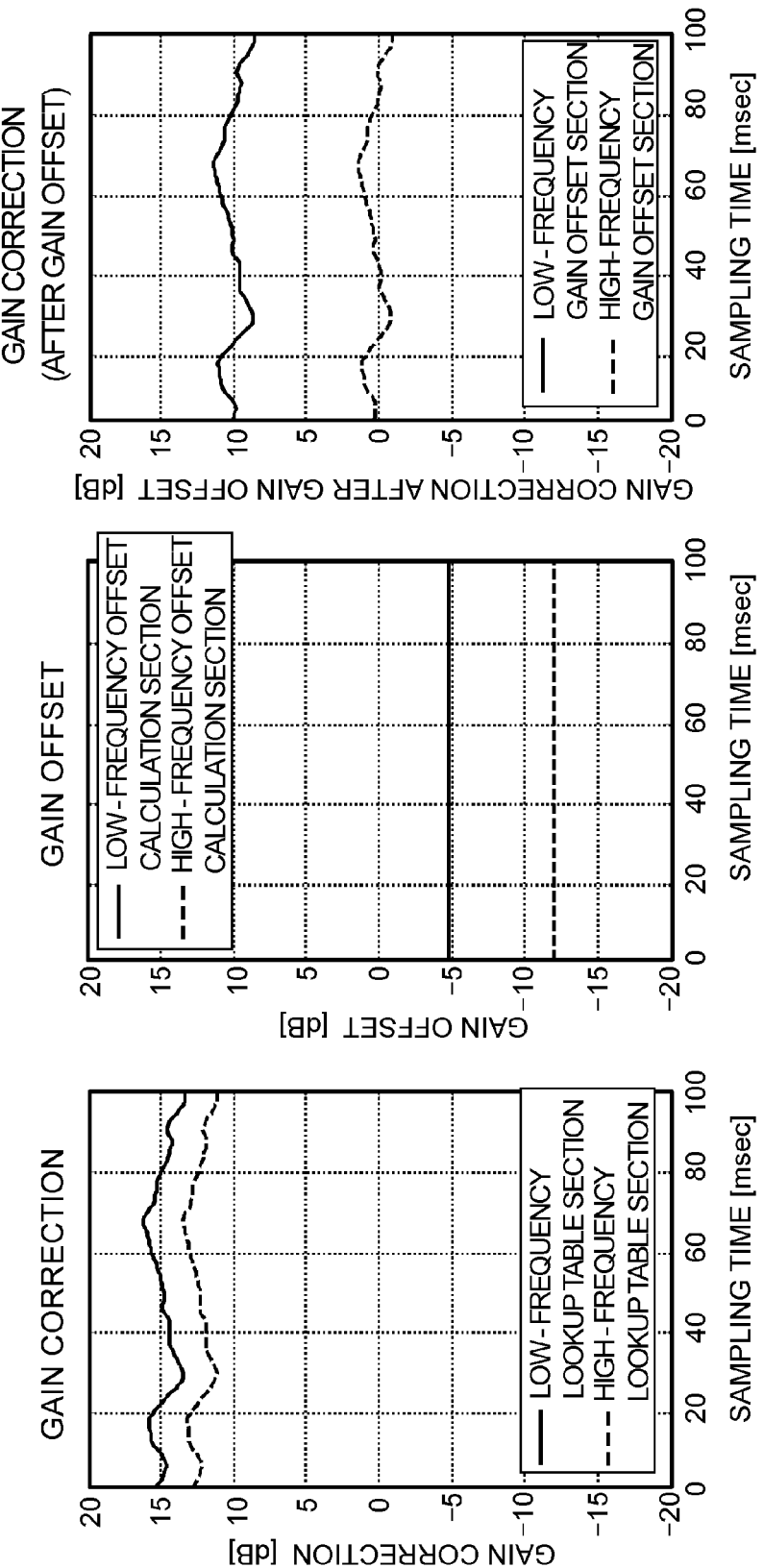
FIG. 11(a) is a graph showing correction gains of signals output from the low-frequency lookup table section and high-frequency lookup table section.
FIG. 11(b) shows gain offset amounts of the low-frequency gain and high-frequency gain set in the low-frequency offset calculation section and high-frequency offset calculation section.
FIG. 11(c) is a graph showing a state where the signals of FIG. 11(a) that have been subjected to the gain correction are corrected based on the gain offset amounts shown in FIG. 11(b).

FIG. 11(a) is a graph showing signals output from the low-frequency lookup table section 33 and high-frequency lookup table section 34. More specifically, FIG. 11(a) shows signals that have been subjected to the low-frequency gain correction and high-frequency gain correction. FIG. 11(b) shows gain offset amounts of the low-frequency gain and high-frequency gain set in the low-frequency offset calculation section 36 and high-frequency offset calculation section 37.

FIG. 11(c) is a graph showing a state where the signals of FIG. 11(a) that have been subjected to the gain correction are corrected based on the gain offset amounts shown in FIG. 11(b). In FIG. 11(c), a gain reduction of 5 dB is applied to the low-frequency gain, and gain reduction of 12 dB is applied to the high-frequency gain.

The low-frequency gain conversion section 41 and high-frequency gain conversion section 42 perform conversion processing for the high-frequency and low-frequency gains prior to gain correction that the gain setting section 5 performs for the high-frequency and low-frequency portions of the audio signal so as to allow desirable gains to be obtained in the gain setting section 5.

The low-frequency gain conversion section 41 and high-frequency gain conversion section 42 apply gain conversion to the input signals that have been subjected to the gain correction by the low-frequency gain offset section 39 and high-frequency gain offset section 40 according to the following expression.

$$y = (10^{(x/20)}) - 1$$

where x is an input signal (its unit is decibel [dB]), y is an output signal after conversion (its unit is linear), and ^ is a sign indicating exponentiation.

The LPF sections 43 and 44 perform smoothing for the signals output from the low-frequency gain conversion section 41 and high-frequency gain conversion section 42 by using a general smoothing low-pass filter.

[Gain Setting Section]

The gain setting section 5 performs gain adjustment (signal level variable processing) for the low-frequency and high-frequency portions of the audio signal that have been subjected to the loudness processing by the loudness filter section 2 in accordance with the signal level of the audio signal so as to make the loudness effect of the audio signal favorable.

Figure 12:
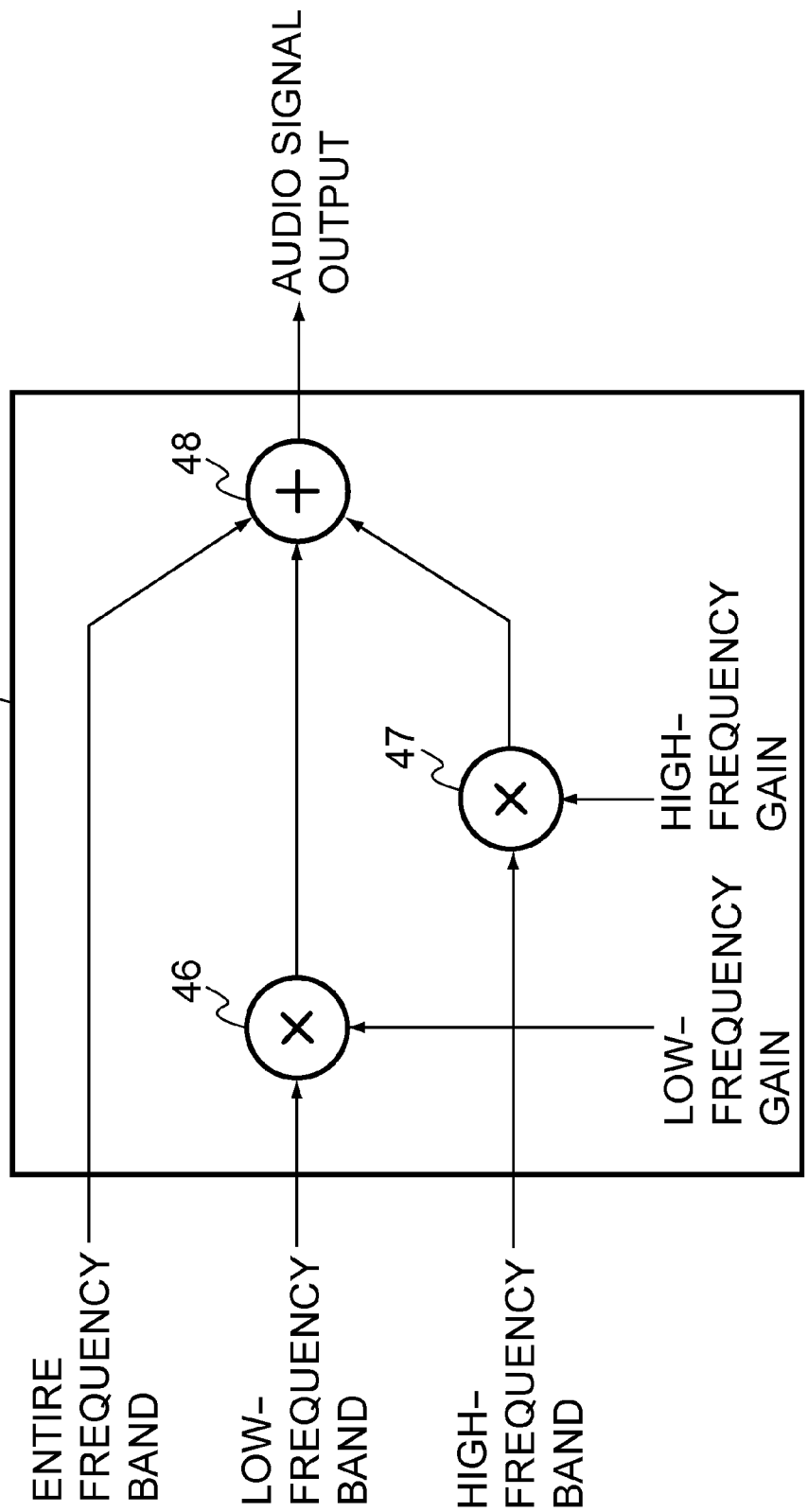
FIG. 12 is a block diagram showing a schematic configuration of a gain setting section according to the present embodiment.

As shown in FIG. 12, the gain setting section 5 includes multiplication sections 46 and 47 and an addition section 48. The multiplication section 46 of the gain setting section 5 multiplies the input audio signal of the low-frequency band by the low-frequency gain output from the gain calculation section 4. The multiplication section 47 multiplies the input audio signal of the high-frequency band by the high-frequency gain output from the gain calculation section 4. After that, the addition section 48 adds the audio signal of the original frequency band input from the loudness filter section 2, audio signal of the low-frequency band that has been subjected to the low-frequency gain multiplication processing by the multiplication section 46, and audio signal of the high-frequency band that has been subjected to the high-frequency gain multiplication processing by the multiplication section 47 and outputs an audio signal in which the loudness effect is made favorable.

Figures 14A, 14B, 14C:
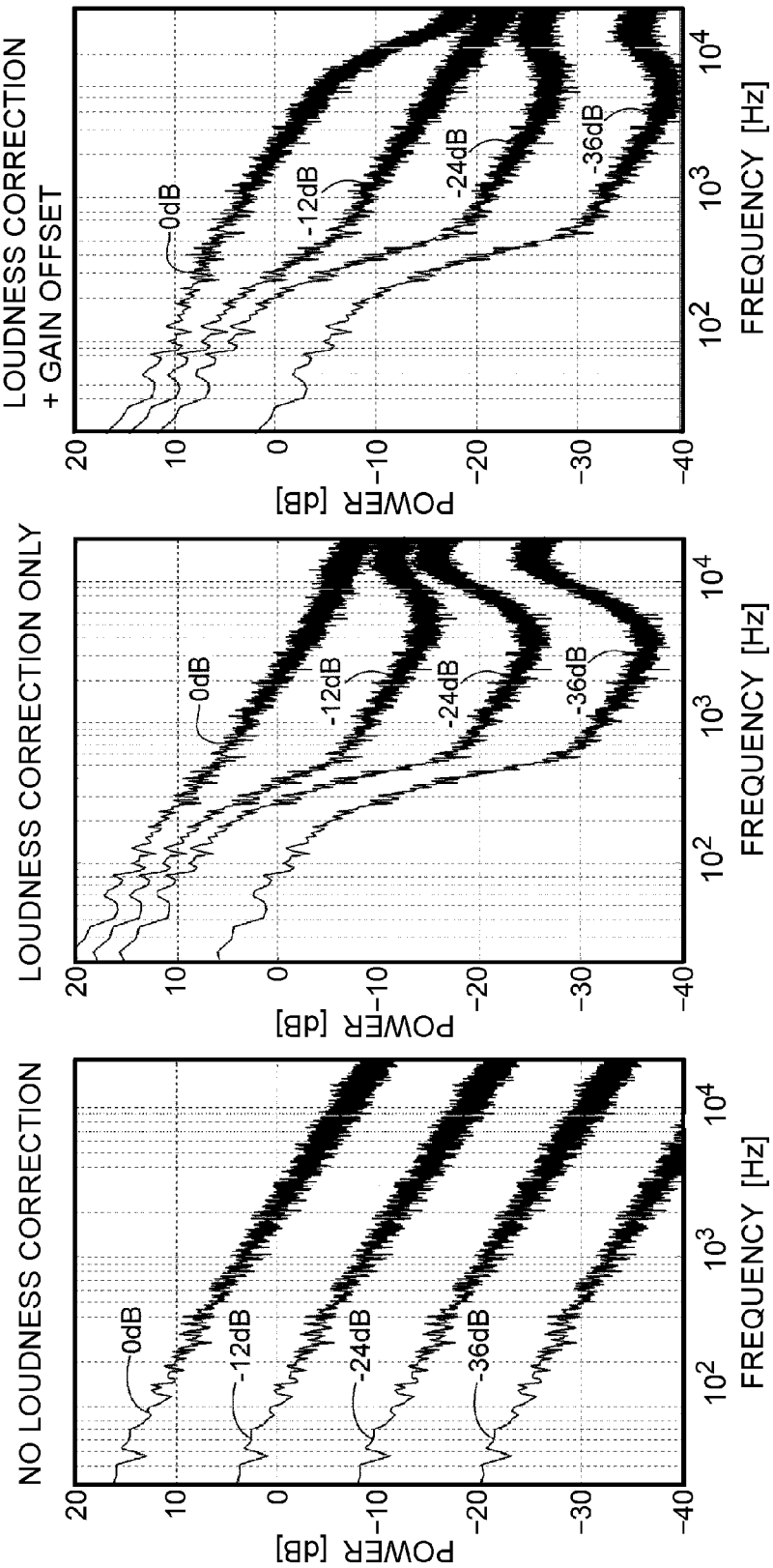

FIGS. 13(a) to 13(c) show frequency characteristic changes of white noises in the case where signal levels are set to 0 dB, −12 dB, −24 dB and −36 dB, respectively. FIGS. 14(a) to 14(c) show frequency characteristic changes of pink noises in the case where input signal levels are set to 0 dB, −12 dB, −24 dB and −36 dB, respectively.

More specifically, FIGS. 13(a) and 14(a) show frequency characteristic changes of the white noise and pink noise in the case where the auditory sense correction device 1 of the present embodiment is not used. FIGS. 13(b) and 14(b) show frequency characteristic changes of the white noise and pink noise in the case where only the loudness correction is applied. FIGS. 13(c) and 14(c) show frequency characteristic changes of the white noise and pink noise in the case where the auditory sense correction device 1 of the present embodiment is used.

As shown in FIG. 13(b) and FIG. 14(b), when the loudness correction is applied to the respective audio signals, the levels of the low-frequency and high-frequency bands are increased as compared to those of the audio signals shown in FIG. 13(a) and FIG. 14(a) to which no correction has been applied. When the auditory sense correction device 1 of the present embodiment is used to apply the loudness correction and gain offset processing to the audio signals, the gains of the low-frequency and high-frequency bands can be suppressed as shown in FIG. 13(c) and FIG. 14(c). Thus, by using the auditory sense correction device 1 of the present invention, even when the output levels of the low-frequency and high-frequency bands have been extremely enhanced by the loudness processing performed by the loudness filter section 2, it is possible to adjust the gains of the low-frequency and high-frequency bands to suitable levels.

In particular, as is clear from FIG. 13(c) and FIG. 14(c), when the signal level is high, it is possible to achieve further attenuation of the signal level. Further, as to the white noise in which the level of the high-frequency band is comparatively higher than that of the pink noise, it is possible to achieve further reduction of the level of the high-frequency band.

As described above, in the auditory sense correction device 1 according to the present invention, the gain calculation section 4 uses the gain of the signal level of the signal of the original frequency band to perform the low-frequency gain offset processing and high-frequency gain offset processing based on a level difference between the signal levels of the signals of the original frequency band and the low-frequency band and level difference between the signal levels of the signals of the original frequency band and the high-frequency band to thereby calculate the low-frequency and high-frequency gain for correction processing. Then, the gain setting section 5 performs low-frequency and high-frequency correction processing for the audio signals of the low-frequency band and high-frequency band that have been subjected to the loudness processing by the loudness filter section 2. Thus, in the audio signal that has been subjected to the loudness processing by the auditory sense correction device 1, the levels of the high-frequency and low-frequency bands are corrected using the high-frequency and low-frequency gains, so that even an audio source in which the levels of the high-frequency and low-frequency bands have previously been enhanced can exhibit proper loudness effect.

In particular, the gain calculation section 4 samples the audio signal that has been subjected to the loudness correction to calculate a level difference between the levels of the signals of the original frequency band and low-frequency band and a level difference between the levels of the signals of the original frequency band and high-frequency band. After that, the gain calculation section 4 calculates the low-frequency and high-frequency gains for correction processing based on the calculated level differences of each frequency band. Thus, values of the low-frequency and high-frequency gains are calculated in accordance with the enhanced state (enhanced degree) of the audio source in which the levels of the low-frequency and high-frequency bands have been enhanced. As a result, no matter what type of an audio source is used, it is possible to add optimum loudness characteristics to an audio signal generated from the audio source in accordance with (and eventually, without depending on) the characteristics thereof.

Thus, the auditory sense correction device 1 is used to perform the loudness correction to thereby apply suitable loudness correction without depending on the high-frequency and low-frequency acoustic characteristics of the audio signal, preventing distorted sound from being output from a speaker, which allows a user to listen to music with high sound quality.

Although the present invention has been shown and described with reference to the accompanying drawings, the auditory sense correction device of the present invention is not limited to the above embodiment. It will be apparent to those having ordinary skill in the art that a number of modifications or alternations to the invention as described herein may be made, none of which depart from the spirit of the present invention. All such modifications and alternations should therefore be seen as within the scope of the present invention.

For example, in the present embodiment, the loudness filter section 2 divides an audio signal into audio signals of three frequency bands: original, low, and high-frequency bands, and the maximum value detection and maximum value hold section 3, gain calculation section 4, and gain setting section 5 each perform the processing corresponding to the above three frequency bands. However, in the present invention, the audio signal need not be divided into audio signals of three frequency bands: original, low, and high-frequency bands but may be divided into four or more or into two frequency bands.

The invention claimed is:

1. An auditory sense correction device comprising:
    a frequency band divider configured to divide an original audio signal in an original frequency band into first and second audio signals in first and second frequency bands, the original frequency band including the first and second frequency bands, the first frequency band being different from the second frequency band;
    a level difference calculator configured to calculate a difference between signal level of the first audio signal in the first frequency band and signal level of the original audio signal as a first differential signal, the level difference calculator being configured to calculate a difference between signal level of the second audio signal in the second frequency band and signal level of the original audio signal as a second differential signal;
    a gain offset calculator configured to calculate a first correction gain by applying offset processing to a first gain of the first audio signal based on the first differential signal calculated by the level difference calculator, the gain offset calculator being configured to calculate a second correction gain by applying the offset processing to a second gain of the second audio signal based on the second differential signal calculated by the level difference calculator;
    a gain setter configured to generate a first corrected audio signal by multiplying the first audio signal by the first correction gain and configured to generate a second corrected audio signal by multiplying the second audio signal by the second correction gain, the gain setter being configured to add the first and second corrected audio signals to the original audio signal in the original frequency band;
    a first response speed controller configured to perform response speed control for the original audio signal in the original frequency band to make a change in the signal level of the original audio signal gradual; and
    a gain corrector configured to apply gain correction to the original audio signal whose signal level has been changed by the first response speed controller in accordance with the first and second frequency bands to be subjected to the offset processing by the gain offset calculator, wherein
    the gain offset calculator is configured to perform the offset processing for a signal that has been subjected to the gain correction by the gain corrector.

2. The auditory sense correction device according to claim 1, further comprising:
    a second response speed controller configured to perform response speed control for the first and second differential signals calculated by the level difference calculator to average the first and second differential signals, respectively; and
    an offset calculator configured to calculate a first gain offset amount used in the offset processing performed by the gain offset calculator based on the first differential signal averaged by the second response speed controller, the offset calculator being configured to calculate a second gain offset amount used in the offset processing performed by the gain offset calculator based on the second differential signal averaged by the second response speed controller, wherein
    the gain offset calculator is configured to perform the offset processing by using the first and second gain offset amounts calculated by the offset calculator to calculate the first and second correction gains, respectively.

3. An auditory sense correction device comprising:

a frequency band divider configured to divide an original audio signal in an original frequency band into first and second audio signals in first and second frequency bands, the original frequency band including the first and second frequency bands, the first frequency band being different from the second frequency band;

a level difference calculator configured to calculate a difference between signal level of the first audio signal in the first frequency band and signal level of the original audio signal as a first differential signal, the level difference calculator being configured to calculate a difference between signal level of the second audio signal in the second frequency band and signal level of the original audio signal as a second differential signal;

a gain offset calculator configured to calculate a first correction gain by applying offset processing to a first gain of the first audio signal based on the first differential signal calculated by the level difference calculator, the gain offset calculator being configured to calculate a second correction gain by applying the offset processing to a second gain of the second audio signal based on the second differential signal calculated by the level difference calculator;

a gain setter configured to generate a first corrected audio signal by multiplying the first audio signal by the first correction gain and configured to generate a second corrected audio signal by multiplying the second audio signal by the second correction gain, the gain setter being configured to add the first and second corrected audio signals to the original audio signal in the original frequency band; and a gain corrector configured to calculate the first gain of the first audio signal and the second gain of the second audio signal based on the original audio signal, wherein the gain offset calculator is configured to calculate a first offset amount based on the first differential signal and is configured to calculate the first correction gain using the first offset amount, and wherein the gain offset calculator is configured to calculate a second offset amount based on the second differential signal and is configured to calculate the second correction gain using the second offset amount.

4. The auditory sense correction device according to claim 3, wherein the gain corrector is configured to store a first gain lookup table indicating relationship between the original audio signal and the first gain of the first audio signal, and a second gain lookup table indicating relationship between the original audio signal and the second gain of the second audio signal, wherein the gain corrector is configured to calculate the first gain of the first audio signal based on the original audio signal and the first gain lookup table, and wherein the gain corrector is configured to calculate the second gain of the second audio signal based on the original audio signal and the second gain lookup table.

5. An auditory sense correction device comprising:

a frequency band divider configured to divide an original audio signal in an original frequency band into first and second audio signals in first and second frequency bands, the original frequency band including the first and second frequency bands, the first frequency band being different from the second frequency band;

a level difference calculator configured to calculate a difference between signal level of the first audio signal in the first frequency band and signal level of the original audio signal as a first differential signal, the level difference calculator being configured to calculate a difference between signal level of the second audio signal in the second frequency band and signal level of the original audio signal as a second differential signal;

a gain offset calculator configured to calculate a first correction gain by applying offset processing to a first gain of the first audio signal based on the first differential signal calculated by the level difference calculator, the gain offset calculator being configured to calculate a second correction gain by applying the offset processing to a second gain of the second audio signal based on the second differential signal calculated by the level difference calculator;

a gain setter configured to generate a first corrected audio signal by multiplying the first audio signal by the first correction gain and configured to generate a second corrected audio signal by multiplying the second audio signal by the second correction gain, the gain setter being configured to add the first and second corrected audio signals to the original audio signal in the original frequency band; and a gain corrector configured to calculate the first gain of the first audio signal and the second gain of the second audio signal based on the original audio signal.

6. The auditory sense correction device according to claim 5, wherein the gain corrector is configured to store a first gain lookup table indicating relationship between the original audio signal and the first gain of the first audio signal, and a second gain lookup table indicating relationship between the original audio signal and the second gain of the second audio signal, wherein the gain corrector is configured to calculate the first gain of the first audio signal based on the original audio signal and the first gain lookup table, and wherein the gain corrector is configured to calculate the second gain of the second audio signal based on the original audio signal and the second gain lookup table.

7. An auditory sense correction device comprising:

a frequency band divider configured to divide an original audio signal in an original frequency band into first and second audio signals in first and second frequency bands, the original frequency band including the first and second frequency bands, the first frequency band being different from the second frequency band;

a level difference calculator configured to calculate a difference between signal level of the first audio signal in the first frequency band and signal level of the original audio signal as a first differential signal, the level difference calculator being configured to calculate a difference between signal level of the second audio signal in the second frequency band and signal level of the original audio signal as a second differential signal;

a gain offset calculator configured to calculate a first correction gain by applying offset processing to a first gain of the first audio signal based on the first differential signal calculated by the level difference calculator, the gain offset calculator being configured to calculate a second correction gain by applying the offset processing to a second gain of the second audio signal based on the second differential signal calculated by the level difference calculator;

a gain setter configured to generate a first corrected audio signal by multiplying the first audio signal by the first correction gain and configured to generate a second corrected audio signal by multiplying the second audio signal by the second correction gain, the gain setter being configured to add the first and second corrected audio signals to the original audio signal in the original frequency band;

an original maximum value detector configured to calculate an absolute value of the signal level of the original audio signal as an original absolute value and detect a maximum value of the original absolute value as an original maximum value;

a first maximum value detector configured to calculate an absolute value of the signal level of the first audio signal divided by the frequency band divider as a first absolute value and detect a maximum value of the first absolute value as a first maximum value; and a second maximum value detector configured to calculate an absolute value of the signal level of the second audio signal divided by the frequency band divider as a second absolute value and detect a maximum value of the second absolute value as a second maximum value.

8. The auditory sense correction device according to claim 7,
wherein the level difference calculator is configured to calculate the first differential signal based on the original maximum value and the first maximum value, and
wherein the level difference calculator is configured to calculate the second differential signal based on the original maximum value and the second maximum value.

9. An auditory sense correction device comprising:
frequency band dividing means for dividing an original audio signal in an original frequency band into first and second audio signals in first and second frequency bands, the original frequency band including the first and second frequency bands, the first frequency band being different from the second frequency band;
level difference calculating means for calculating a difference between signal level of the first audio signal and signal level of the original audio signal as a first differential signal, the level difference calculating means being for calculating a difference between signal level of the second audio signal in the second frequency band and signal level of the original audio signal as a second differential signal;
gain offset calculating means for calculating a first correction gain by applying offset processing to a first gain of the first audio signal based on the first differential signal calculated by the level difference calculating means, the gain offset calculating means being for calculating a second correction gain by applying the offset processing to a second gain of the second audio signal based on the second differential signal calculated by the level difference calculating means;
gain setting means for generating a first corrected audio signal by multiplying the first audio signal by the first correction gain and for generating a second corrected audio signal by multiplying the second audio signal by the second correction gain, the gain setting means being for adding the first and second corrected audio signals to the original audio signal in the original frequency band;
first response speed controlling means for performing response speed control for the original audio signal in the original frequency band to make a change in the signal level of the original audio signal gradual; and gain correcting means for applying gain correction to the original audio signal whose signal level has been changed by the first response speed controlling means in accordance with the first and second frequency bands to be subjected to the offset processing by the gain offset calculating means, wherein
the gain offset calculating means is for performing the offset processing for a signal that has been subjected to the gain correction by the gain correcting means.

10. The auditory sense correction device according to claim 9, further comprising:
second response speed controlling means for performing response speed control for the first and second differential signals calculated by the level difference calculating means to average the first and second differential signals, respectively; and
offset calculating means for calculating a first gain offset amount used in the offset processing performed by the gain offset calculating means based on the first differential signal averaged by the second response speed controlling means, the offset calculating means being for calculating a second gain offset amount used in the offset processing performed by the gain offset calculating means based on the second differential signal averaged by the second response speed controlling means, wherein
the gain offset calculating means is for performing the offset processing by using the first and second gain offset amounts calculated by the offset calculating means to calculate the first and second correction gains, respectively.

11. An auditory sense correction device comprising:
frequency band dividing means for dividing an original audio signal in an original frequency band into first and second audio signals in first and second frequency bands, the original frequency band including the first and second frequency bands, the first frequency band being different from the second frequency band;
level difference calculating means for calculating a difference between signal level of the first audio signal and signal level of the original audio signal as a first differential signal, the level difference calculating means being for calculating a difference between signal level of the second audio signal in the second frequency band and signal level of the original audio signal as a second differential signal;
gain offset calculating means for calculating a first correction gain by applying offset processing to a first gain of the first audio signal based on the first differential signal calculated by the level difference calculating means, the gain offset calculating means being for calculating a second correction gain by applying the offset processing to a second gain of the second audio signal based on the second differential signal calculated by the level difference calculating means;
gain setting means for generating a first corrected audio signal by multiplying the first audio signal by the first correction gain and for generating a second corrected audio signal by multiplying the second audio signal by the second correction gain, the gain setting means being for adding the first and second corrected audio signals to the original audio signal in the original frequency band; and
gain correcting means for calculating the first gain of the first audio signal and the second gain of the second audio signal based on the original audio signal, wherein the gain offset calculating means is for calculating a first offset amount based on the first differential signal and is for calculating the first correction gain using the first offset amount, and wherein the gain offset calculating means is for calculating a second offset amount based on the second differential signal and is for calculating the second correction gain using the second offset amount.

12. The auditory sense correction device according to claim 11, wherein the gain correcting means is for storing a first gain lookup table indicating relationship between the original audio signal and the first gain of the first audio signal, and a second gain lookup table indicating relationship between the original audio signal and the second gain of the second audio signal, wherein the gain correcting means is for calculating the first gain of the first audio signal based on the original audio signal and the first gain lookup table, and wherein the gain correcting means is for calculating the second gain of the second audio signal based on the original audio signal and the second gain lookup table.

\* \* \* \* \*